United States Patent
Kim et al.

(10) Patent No.: US 8,454,851 B2
(45) Date of Patent: Jun. 4, 2013

(54) MANUFACTURING METHOD OF THE FLEXIBLE DISPLAY DEVICE

(75) Inventors: Chang Dong Kim, Seoul (KR); Hyun Sik Seo, Gyeonggi-do (KR); Yong In Park, Gyeonggi-do (KR); Seung Han Paek, Incheon (KR); Jung Jae Lee, Gyeonggi-do (KR); Sang Soo Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 642 days.

(21) Appl. No.: 11/827,405

(22) Filed: Jul. 10, 2007

(65) Prior Publication Data

US 2008/0110862 A1 May 15, 2008

(30) Foreign Application Priority Data

Nov. 14, 2006 (KR) .................. 10-2006-0112151
Nov. 28, 2006 (KR) .................. 10-2006-0118457

(51) Int. Cl.
*C03C 15/00* (2006.01)
*H01L 21/30* (2006.01)

(52) U.S. Cl.
USPC .............. 216/83; 216/13; 216/17; 216/23; 216/33; 216/36; 216/96; 216/97; 438/455; 438/456; 438/458; 438/459; 438/689

(58) Field of Classification Search
USPC ............. 438/109, 110, 313, 396, 687, 455, 438/456, 458, 459, 689; 216/23, 96, 97, 33, 216/36, 83, 24, 13, 17
See application file for complete search history.

(56) References Cited

U.S. PATENT DOCUMENTS

| | | | |
|---|---|---|---|
| 3,786,172 A * | 1/1974 | Conley .................... | 174/257 |
| 5,456,788 A * | 10/1995 | Barbee et al. ........... | 156/345.16 |
| 5,756,403 A * | 5/1998 | Tijburg et al. ........... | 438/745 |
| 5,891,597 A * | 4/1999 | Lee ......................... | 430/7 |
| 6,197,209 B1 * | 3/2001 | Shin et al. ............... | 216/84 |
| 6,496,234 B1 * | 12/2002 | Lee ......................... | 349/40 |
| 6,861,670 B1 * | 3/2005 | Ohtani et al. ............ | 257/66 |
| 6,967,115 B1 * | 11/2005 | Sheats ..................... | 438/22 |
| 6,982,181 B2 * | 1/2006 | Hideo ...................... | 438/30 |

(Continued)

FOREIGN PATENT DOCUMENTS

| CN | 1517749 A | 8/2004 |
|---|---|---|
| JP | 11279775 A | 10/1999 |

(Continued)

OTHER PUBLICATIONS

Office Action issued in corresponding Chinese Patent Application No. 1517749A; issued Mar. 20, 2009.

(Continued)

*Primary Examiner* — Nadine Norton
*Assistant Examiner* — Christopher Remavege
(74) *Attorney, Agent, or Firm* — Brinks Hofer Gilson & Lione

(57) ABSTRACT

A method for manufacturing a flexible display device in which a flexible substrate is acquired by forming display devices on one side of the substrate and thinning the substrate by removing surface portions on an opposite side of the substrate. The thickness of the substrate is changed from a first thickness, which gives rigidity to the substrate to the second thickness, which gives flexibility to the substrate.

7 Claims, 14 Drawing Sheets

U.S. PATENT DOCUMENTS

| | | | |
|---|---|---|---|
| 7,029,960 B2* | 4/2006 | Hashimoto et al. | 438/164 |
| 7,102,726 B2* | 9/2006 | Byun et al. | 349/189 |
| 7,211,950 B2* | 5/2007 | Yi et al. | 313/512 |
| 7,271,415 B2 | 9/2007 | Takechi | |
| 7,355,323 B2* | 4/2008 | Otose | 310/317 |
| 7,592,239 B2* | 9/2009 | Park et al. | 438/479 |
| 7,736,997 B2* | 6/2010 | Takechi | 438/459 |
| 8,349,194 B2* | 1/2013 | Paek et al. | 216/13 |
| 2003/0223030 A1* | 12/2003 | Byun et al. | 349/187 |
| 2004/0142118 A1* | 7/2004 | Takechi | 428/1.6 |
| 2004/0195569 A1* | 10/2004 | Hashimoto et al. | 257/69 |
| 2005/0146776 A1* | 7/2005 | Kanbe | 359/296 |
| 2005/0245165 A1* | 11/2005 | Harada et al. | 445/24 |
| 2007/0138949 A1* | 6/2007 | Yoshida et al. | 313/504 |
| 2008/0113302 A1* | 5/2008 | Takashima et al. | 430/322 |
| 2008/0212010 A1* | 9/2008 | Ohara et al. | 349/143 |
| 2008/0277375 A1* | 11/2008 | Paek et al. | 216/17 |

FOREIGN PATENT DOCUMENTS

| | | |
|---|---|---|
| KR | 20040064601 A | 7/2004 |
| TW | I242176 | 10/2005 |
| TW | 200539742 | 12/2005 |

OTHER PUBLICATIONS

Office Action issued in corresponding Taiwan Patent Application No. 096123886, dated Jul. 13, 2011.

Office Action issued in corresponding Korean Patent Application No. 10-2006-0112151, mailed Nov. 8, 2012.

* cited by examiner

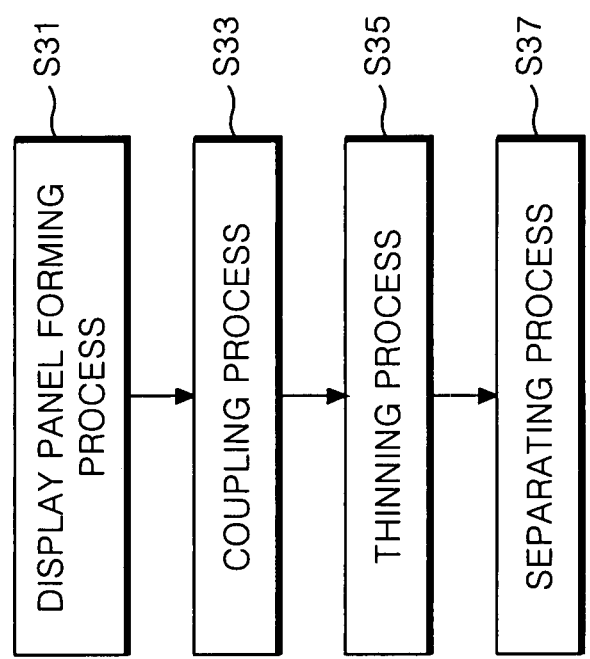

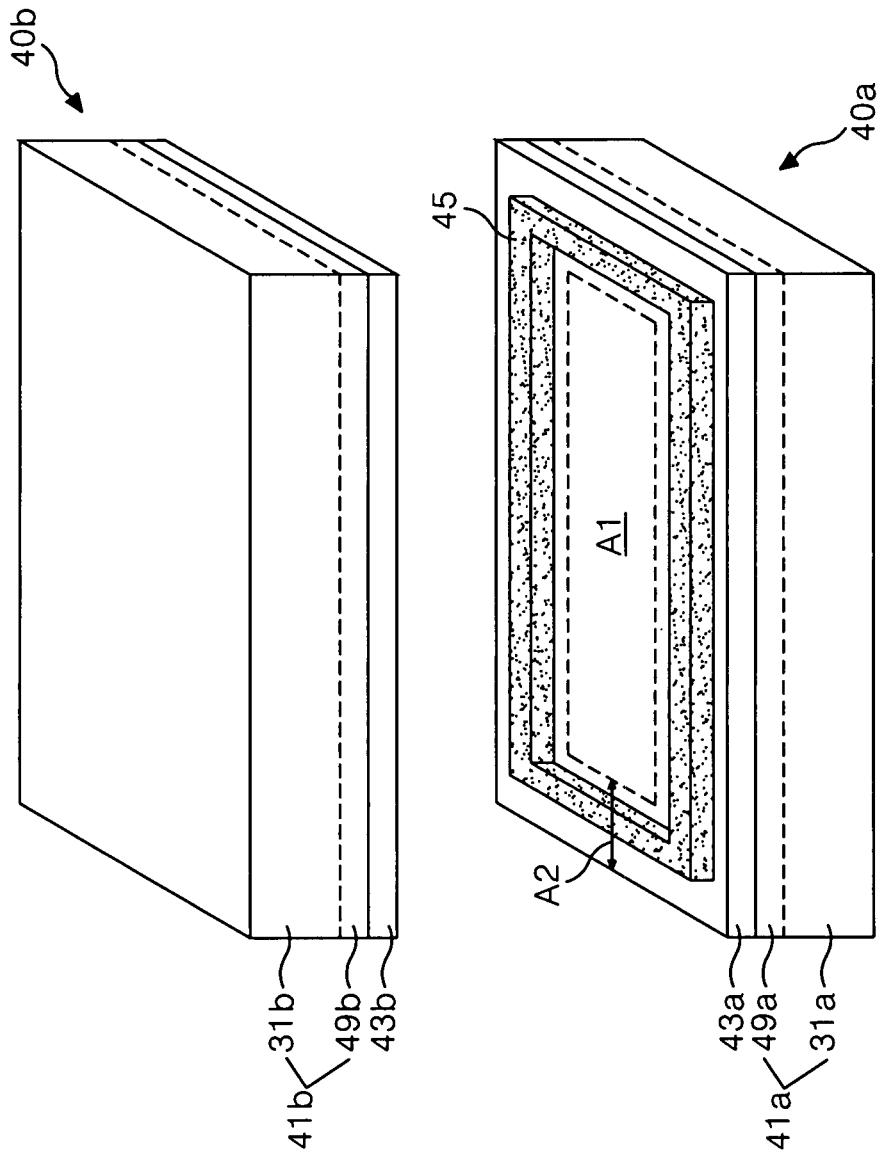

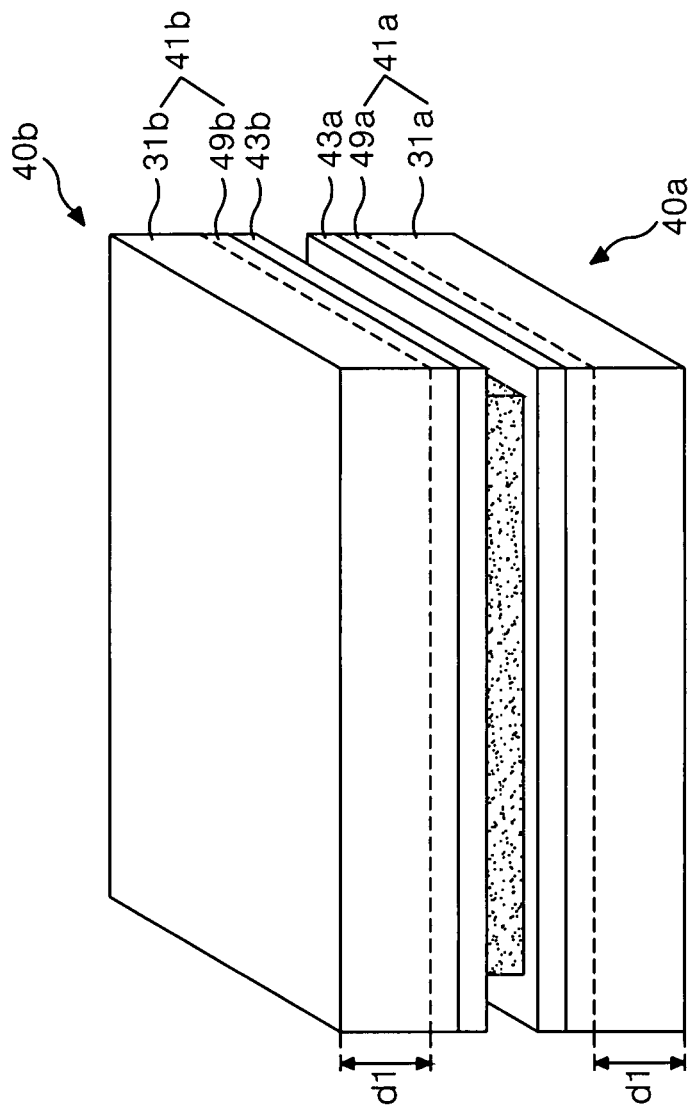

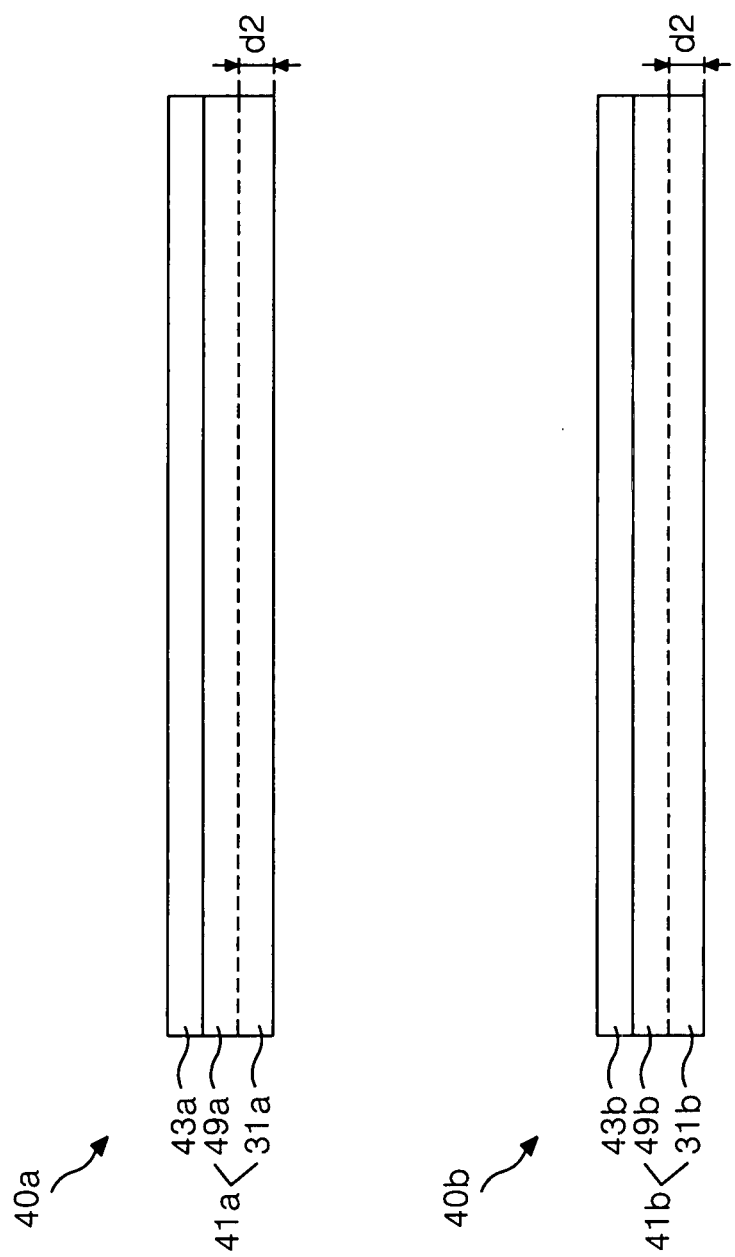

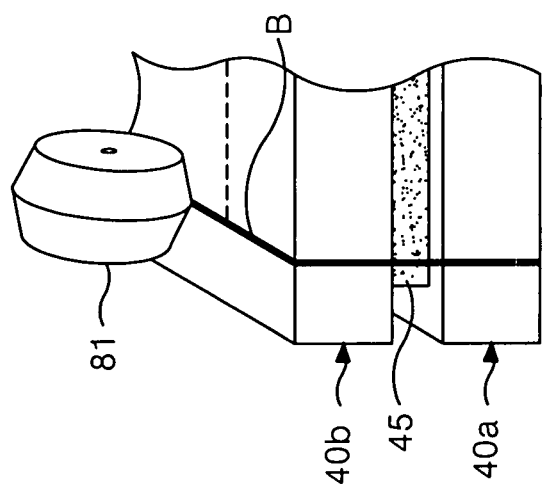

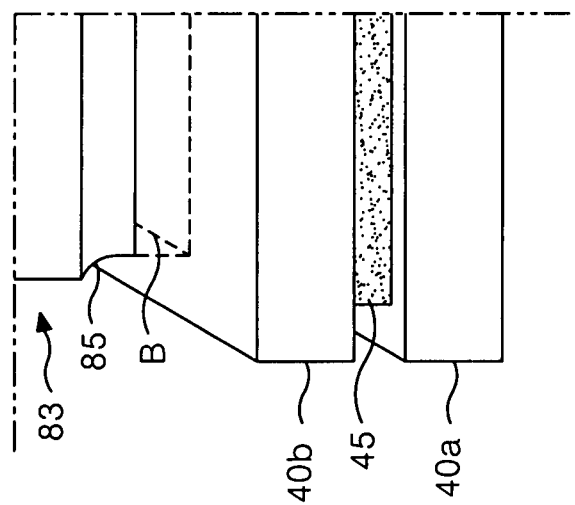

MANUFACTURING METHOD OF THE FLEXIBLE DISPLAY DEVICE

PRIORITY CLAIM

This application claims priority under 35 U.S.C. §119(a) to Korean Patent Applications Nos. 10-2006-112151 and 10-2006-118457 filed on Nov. 14, 2006 and Nov. 28, 2006, respectively, which are hereby incorporated by reference in their entirety.

BACKGROUND

1. Technical Field

The present invention relates to a flexible display device and a method for manufacturing the flexible display device. More particularly, the present invention relates to a flexible display device and a manufacturing method with improved reliability and reduced defect.

2. Description of the Related Art

In the display device market, a flat panel display (FPD) has replaced a Cathode Ray Tube (CRT) monitor and becomes popular. The FPD includes, for example, a liquid crystal display (LCD), a plasma display panel (PDP) or an organic electro luminescence display (OLED). The FPD is lighter and thinner than the CRT. The FPD may be easily applied to large size display systems or portable display systems. A glass substrate has been used in the FPD because it can endure high temperature applied in the manufacturing processes. Due to the rigid properties under the room temperature, the glass substrate may not be suitable for the flexible display device. Recently, flexible materials are used for the FPD to develop the flexible display device which can be rolled or folded. Such flexible display device may be deformed in any conditions. Using a flexible material such as plastic film, the flexible display device having the same displaying performance in the rolled or bent state becomes popular.

FIG. 1 illustrates a flow chart showing a manufacturing method of a flexible display device according to the related art. Referring to FIG. 1, the manufacturing method includes an adhering process (S1), a display panel forming process (S3) and a peeling-off process (S5). In the adhering process (S1), a rigid substrate is temporarily attached to the back surface of a flexible substrate for supporting the flexible substrate rigidly during the manufacturing process. It is also easy to handle the flexible substrate. The rigid supporting substrate adhering to the back surface of the flexible substrate further secures the flexible substrate and prevents distortion or deformation of the flexible substrate. With the supported flexible substrate provided by the adhering process (S1), it is possible to carry out the display panel forming process (S3) more precisely in a stable manner.

The display panel forming process (S3) includes processes for forming various patterns which will become driving elements of a display panel. For example, for the flexible display device which is driven by the thin film transistor (TFT), the TFT array should be formed on the flexible substrate. The peeling-off process (S5) separates the supporting substrate and adhesives from the flexible substrate after completing the display panel forming process (S3). The rigid supporting substrate is temporarily attached during the adhering process (S1) and is removed from the flexible substrate after completing the display panel forming process (S3). Removal of the rigid supporting substrate may maximize flexible property of the flexible display device.

The adhesives preferably may not be fully hardened during the display panel forming process (S3) to peel off the flexible substrate from the rigid supporting substrate easily. The upper most limitation of the temperature for the display panel forming process (S3) is less than 150° C. However, it may differ depending on the kind of adhesives. The TFT driving elements formed under 150° C. may experience degraded performance. Driving voltages of the TFT may not be stable, which may affect the reliability of the flexible display device.

Further, in the adhering process (S1), it is undesirable to have air bubbles formed between the flexible substrate and the adhesive layer. The air bubbles may degrade the reliability of the display panel forming process (S3). Additional equipment may be used to apply the adhesive layer between the flexible substrate and the rigid supporting substrate without forming the air bubbles. The development and use of this equipment can increase manufacturing expenses. The adhesives may not be perfectly removed from the flexible substrate in the peeling-off process (S5). The TFT patterns may be damaged by the force which separates the flexible substrate from the rigid supporting substrate. The pattern that is damaged during the peeling-off process (S5) degrades the reliability of the display device. Accordingly, there is a need for a method for manufacturing a flexible display device which obviates drawbacks of the related art.

SUMMARY

In one embodiment, a method for manufacturing a flexible display device includes providing a substrate having a first thickness and forming display devices on one side of the substrate. Surface portions are removed from an opposite side of the substrate, such that the thickness of the substrate is changed from the first thickness, in which the substrate is substantially rigid, to a second thickness in which the substrate is substantially flexible.

In another embodiment, a method for manufacturing a flexible display device includes providing a first panel and a second panel, each panel having a substrate and display devices formed on a face surface thereof. The face surface of the first panel is coupled to the face surface of the second panel and surface portions are removed from a back side of the substrate of the first and second panels, such that the thickness of the substrate is changed from a first thickness, in which the substrate is substantially rigid, to a second thickness in which the substrate is substantially flexible, and the first and the second panels are separated.

In yet another embodiment, a method for manufacturing a flexible display device includes providing a substantially rigid first substrate having a first thickness and providing a substantially rigid second substrate having a second. A face surface of the first substrate and a face surface of the second substrate are coupled. The first substrate is thinned to a third thickness such that the first substrate becomes substantially flexible. The second substrate is thinned to a fourth thickness such that the second substrate becomes substantially flexible.

BRIEF DESCRIPTION OF THE DRAWING

These and other objects of the invention will be apparent from the following detailed description of the embodiments of the present invention with reference to the accompanying drawings, in which:

FIG. 6 illustrates a manufacturing method for a flexible display device according to a second embodiment;

FIGS. 7A and 7B illustrate a Coupling process according to the second embodiment;

FIGS. 10A and 10B illustrate a separating process according to the second embodiment; and FIGS. 11A and 11B illustrate various cutting methods for use with the separating process of FIGS. 10A and 10B.

DETAILED DESCRIPTION OF EMBODIMENTS AND DRAWINGS

The purposes and advantages of the present invention will be described through the preferred embodiments with reference to the attached drawings. The first embodiment will be described referring to FIG. 2 through FIG. 5.

Figure 2:
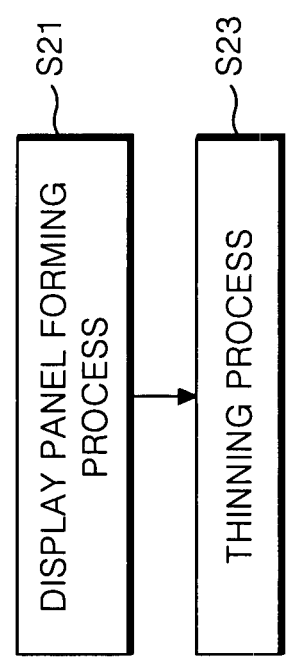
FIG. 2 illustrates a manufacturing method for a flexible display device according to a first embodiment.
Figure 3:
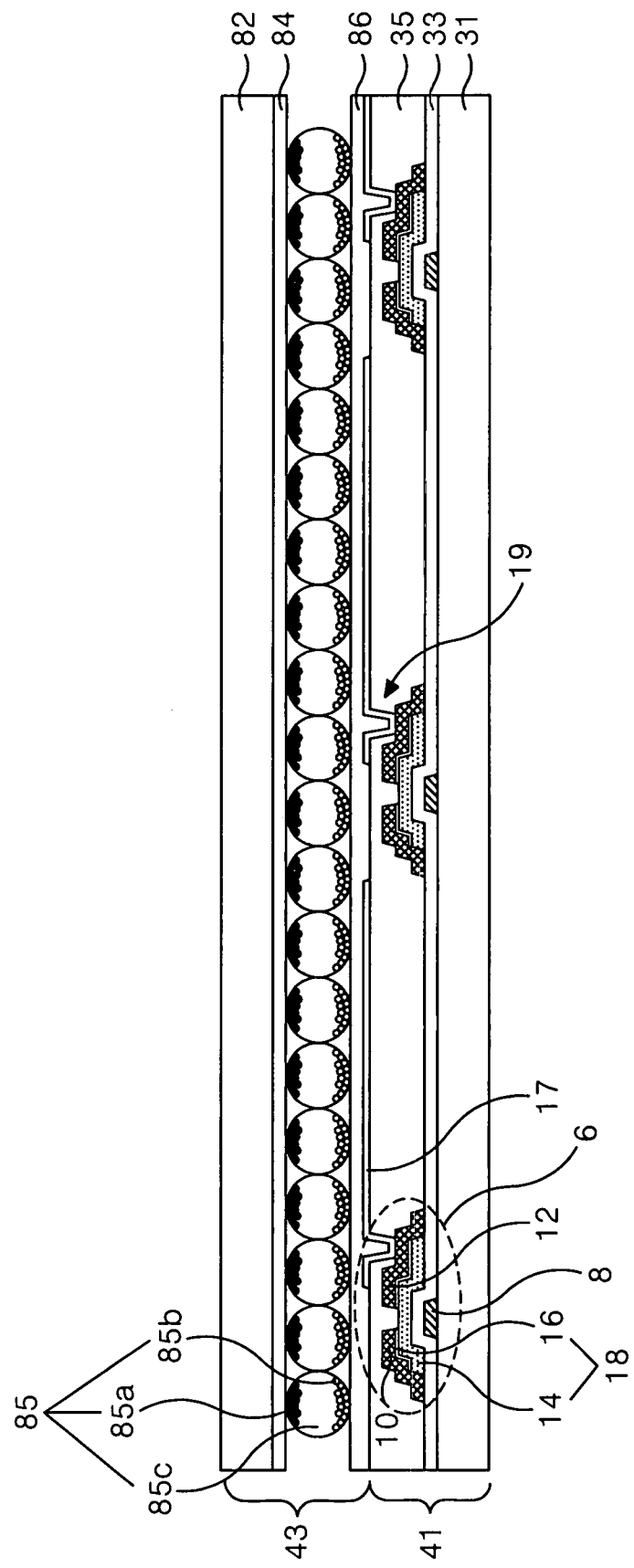
FIG. 3 illustrates display elements manufactured by a display panel forming process shown in FIG. 2.

FIG. 2 illustrates a method for manufacturing a flexible display device according to the first embodiment. In FIG. 2, the method for manufacturing the flexible display includes a Display Device Forming Process (S21) and a Thinning Process (S23). In the Display Device Forming Process (S21), various patterns are formed on a rigid (non-flexible) substrate. The patterns will become a part of the flexible display. For example, an electrophoretic display device (EPD) shown in FIG. 3 is formed by the Display Device Forming Process (S21). The EPD uses the electrophoresis, which is the phenomenon that a charged particle moves to a cathode or an anode when an electric field is applied. The EPD is formed by patterning a thin film transistor (or TFT) array on the non-flexible substrate and attaching an upper layer including electrophoresis particles on the TFT array in the Display Device Forming Process (S21).

In FIG. 3, the EPD manufactured by the Display Device Forming Process (S21) includes a lower array 41 and an upper array 43. The upper array 43 includes a flexible base film 82, an upper electrode 84 formed on the base film 82, and capsules 85 including charged pigment particles and disposed on the upper electrode 84. The base film 82 is made of plastic or flexible thin metal foil. The capsule 85 contains black pigment particles 85a that are attracted to a negative voltage, white pigment particles 85b being attracted to a positive voltage (or vice versa) and solvent 85c. In addition, the lower array 41 includes an adhesive layer 86 to attach the upper array 43 to the completed lower array 41.

The lower array 41 includes, on a lower substrate 31, a plurality of gate lines and a plurality of data lines (not shown) crossing each other. A gate insulating layer 33 is interposed between the gate lines and the data lines. At each crossing, a thin film transistor 6 and a pixel electrode 17 are formed in a cell area defined by the gate and data lines. The thickness of the lower substrate 31 is a first thickness which is rigid enough to endure the deformation stress from the processing conditions in the Display Device Forming Process (S21).

On the lower substrate 31, a buffer layer can be added for enhancing the uniformity of the lower substrate 31 surface and insulating the heat transfer or electrical current to or from the lower substrate 31. The TFT 6 includes a gate electrode 8 supplying a gate voltage, a source electrode 10 connected to the data line, a drain electrode 12 connected to the pixel electrode 17 and an active layer 14 overlapping with the gate electrode 8 and forming a channel between the source electrode 10 and drain electrode 12. The active layer 14 overlaps the source electrode 10 and the drain electrode 12 which form the channel for the flow of electrons between them. On the active layer 14, ohmic layers 16 are disposed under the source electrode 10 and the drain electrode 12, respectively, to form an ohmic contact between the electrodes and the channel layer 14. The active layer 14 and the ohmic layers 16 are referred to as the semiconductor layer 18. The pixel electrode 17 is physically and electrically connected to the drain electrode 12 through the contact hole 19. The contact hole 19 exposes the drain electrode 12 by penetrating a passivation layer 35 covering the TFT 6.

The driving principle for the EPD is as follows. When a gate voltage is applied to the gate electrode 8 in the lower array 41, a picture signal applied through the channel of the TFT 6 to the data line, which charges the pixel electrode 17. At the same time, a basic voltage is applied to the upper electrode 84 in the upper array 43. Therefore, an electric field is formed in the EDP. By the electrophoresis, the black pigment particles 85a and the white pigment particles 85b are separated in the capsule 85. According to the separated amount, black, white or a degree of gray scale can be presented.

Due to the environmental features for manufacturing process, the TFT array is formed on a rigid substrate having a first thickness. Only by way of example, the first thickness may range 0.6 mm to 0.7 mm. The first thickness may be suitable to the case of using glass as the substrate. This condition may be selected by considering the thickness of substrates for a liquid crystal display (LCD). Further, the rigid substrate having the first thickness may be resistant to processing heat. The TFT array for EPD may be formed without restriction or limitation of the processing temperature conditions. Therefore, the TFT array for EPD can be formed over the 150° C. processing temperature, and good performance quality of the driving element (TFT) can be ensured.

The rigid substrate may include a metal substrate, a metal alloy substrate, etc. Preferably, the rigid substrate includes a stainless steel (SUS or STS: hereinafter, referred to as "SUS"). The metal substrate including Fe group is suitable for the thinning process because Fe is easily etchable. However, it is not limited thereto, and metal substrates including Al, Ni, etc. are possible. The first thickness can be selected depending upon the material of the substrate. For example, when SUS is used for the flexible substrate of the EPD, the first thickness is about 0.5~0.6 mm. The thickness of metal substrates may be selected such that bending characteristics of the rigid substrate may be similar to that of the 0.6~0.7 mm glass substrate. This may be advantageous because manufacturing process and equipment for use with the glass substrate are available for the rigid substrate. For another example, the first thickness of the SUS substrate may be about 0.3 mm if the manufacturing line is optimized to the 0.3 mm SUS substrate which has the similar bending characteristics of the 0.35~0.45 glass substrate and the line is applied to the present invention.

Referring back to FIG. 2, the Thinning Process (S23) is an etching process carried out on the other side of the non-flexible, rigid substrate having the first thickness. The Thinning Process (S23) reduces the thickness of the first substrate. With the Thinning Process (S23), the first substrate becomes a second substrate having a second thickness which is thinner than the first thickness. Accordingly, the second substrate can present the flexibility. The rigid first substrate is thinned to have 35% or less of the original substrate thickness. For the flexibility, 65% or more of the first thickness is removed. For example, for an SUS substrate, flexibility may appear when the second thickness may be reduced to about 0.2 mm.

In other embodiment, various other thicknesses are possible for the second thickness. The weight of a substrate is dependent upon the thickness of the substrate. As the substrate is heavy, it may tend to bend more easily. The thickness of the substrate is preferably reduced such that the weight is reduced and the bending of the substrate may be minimized. For example, the second thickness may be 0.1 mm, 0.05 mm, etc. Even if the second thickness is very small, such as 0.05 mm, a display device having the second substrate may not bend because of other structure overlying the second substrate, such as a protection sheet, microcapsules, etc.

The Thinning Process (S23) is performed by contacting the second side (opposite to the first side on which the display device is formed) with an etchant. The etchant includes halogen elements such as chloride (Cl), Bromine (Br) and Iodine (I). For the SUS substrate, the etchant preferably includes iron chloride ($FeCl_2$). The details of the Thinning Process (S23) will be described referring to FIG. 4 and FIG. 5.

Figure 4:
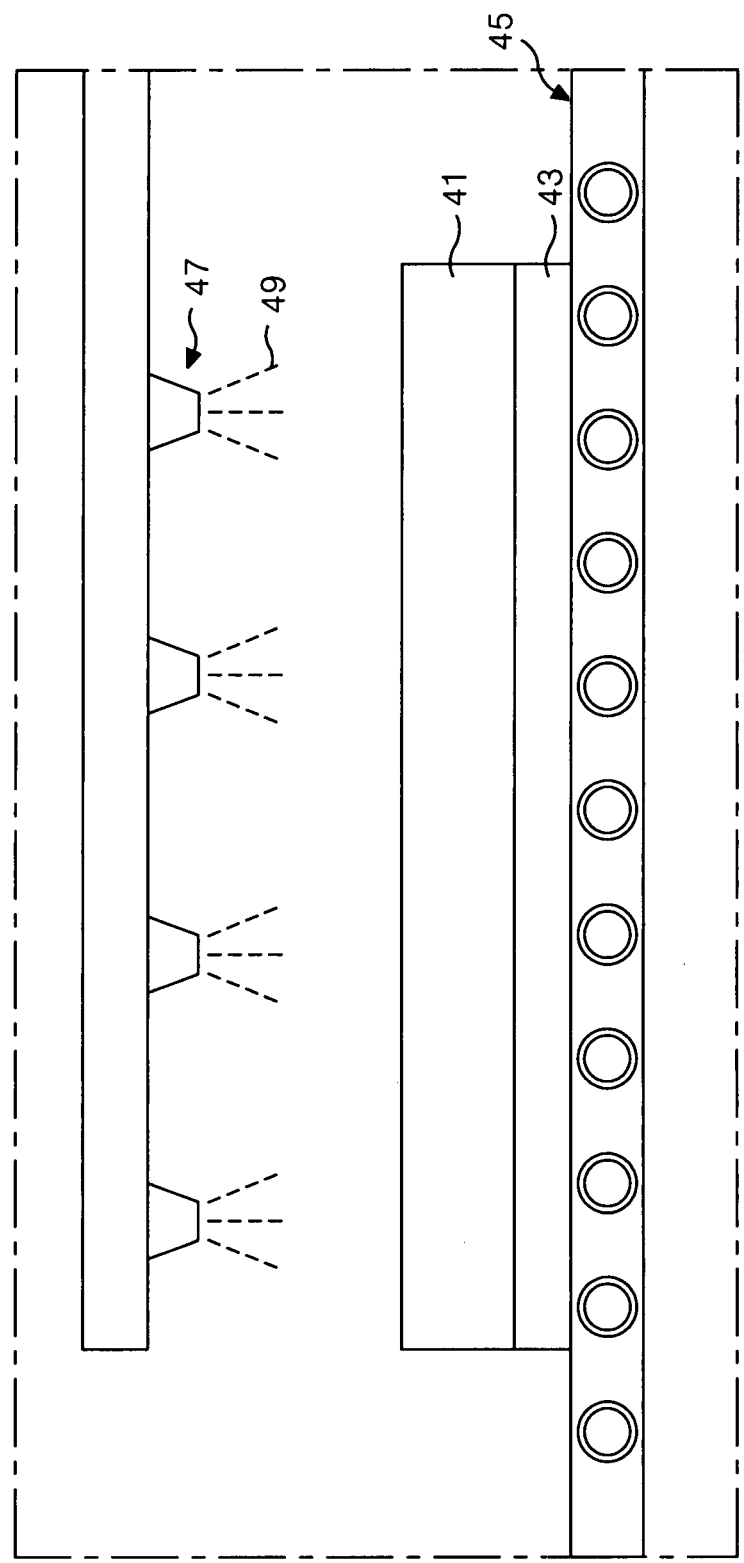
FIG. 4 illustrates one example of a thinning process of FIG. 2.

In FIG. 4, after completing the Display Device Forming Processing (S21), the display panel is mounted on a conveyor belt 45 with the back side of the lower array 41 facing upward. As mentioned above, the TFT array is formed on one side of the non-flexible substrate 31 of the lower array 41. The one side is facing the surface of the conveyor belt 45. The opposite side (back side) of the non-flexible substrate 31 of the lower array 41 is facing upward. The exposed opposite side of the non-flexible substrate 31 of the lower array 41 is etched with the etchant 49 which is sprayed from the nozzle 47 installed above the conveyor belt 45.

Figure 5:
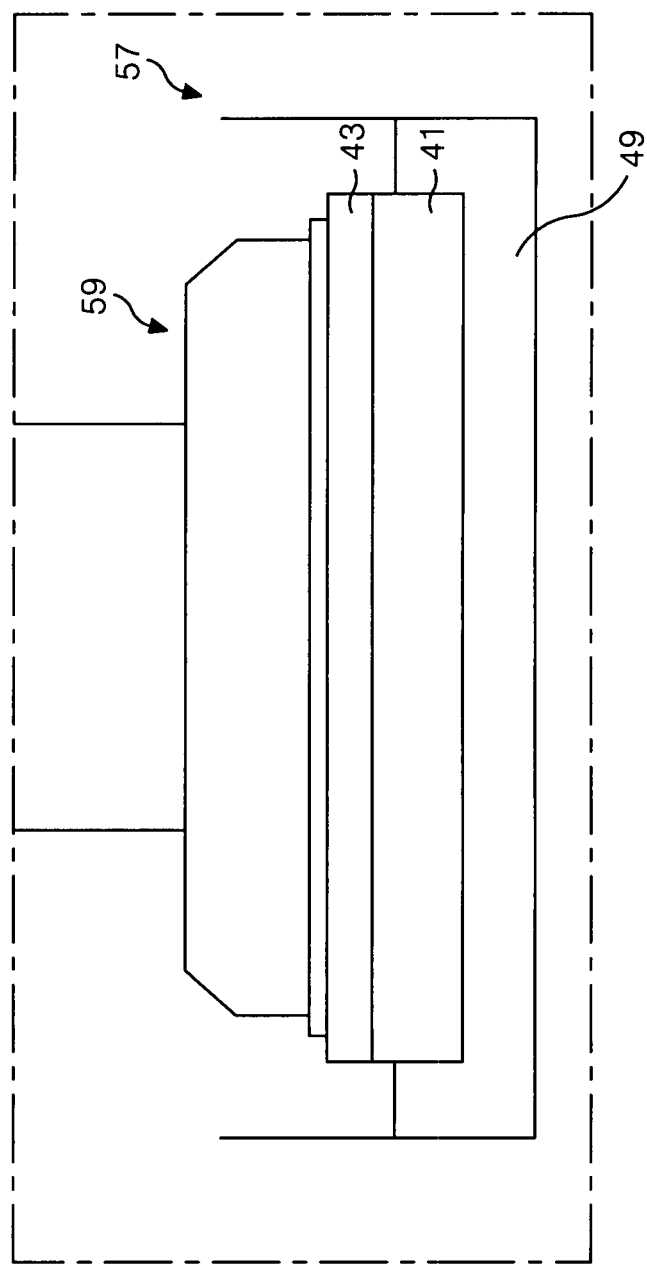
FIG. 5 illustrates another example of a thinning process of FIG. 2.

Referring to FIG. 5, another example of Thinning Process (S23) is illustrated. After completing the Display Device Forming Process (S21), the non-flexible substrate 31 of the lower array 41 is dipped into a bath 57 filled with etchant 49. As mentioned above, on one side of the non-flexible substrate 31 of the lower array 41, the TFT array is formed. The opposite side of the non-flexible substrate 31 of the lower array 41 is dipped into the etchant 49. Then the dipped side is thinned by the etching process. To secure the lower array 41 during the etching process, the upper array 43 may be attached to a holding machine 59 including vacuum adhesion apparatus. After the non-flexible substrate 31 of the lower array 41 is etched to the second thickness, the remained etchant 49 on the lower array 41 is removed by using cleaning water or other cleaning liquid.

Figure 1:
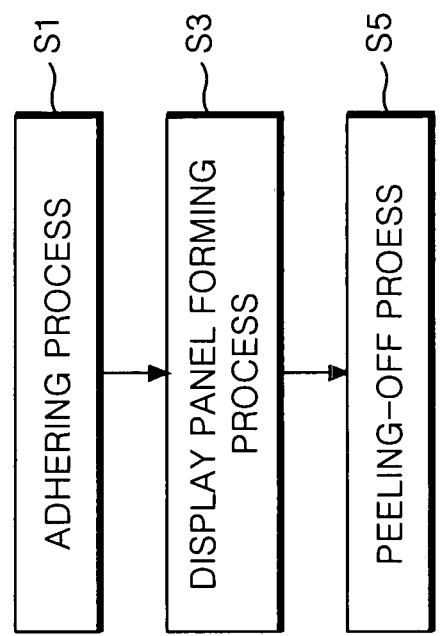
FIG. 1 illustrates a flow chart showing a manufacturing method for a flexible display device according to the related art.

As described above, the one side of the rigid substrate has the first thickness and the other side of the rigid substrate is etched to have the second thickness to give the flexibility to the rigid substrate. Accordingly, the method for flexible display device may not require the adhering process and the peeling-off process (see FIG. 1). Temporary adhesives for attaching the rigid substrate may not be used, which makes high temperature processes possible. Therefore, the reliability of the flexible display device may be enhanced.

In addition, the display devices are formed on the rigid substrate which is resistant to the manufacturing process conditions. The manufacturing cost may not increase and the compatibility with existing manufacturing devices may be obtained.

A second embodiment is described referring to FIG. 6 through FIG. 11b. FIG. 6 illustrates a flow chart for manufacturing a flexible display device according to the second embodiment. The second embodiment includes a Display Device Forming Process (S31), a Coupling Process (S33), a Thinning Process (S35) and a Separation Process (S37).

The Display Device Forming Process (S31) in the second embodiment is described in conjunction with FIG. 2 above. In this second embodiment, two display panels having non-flexible substrates may be thinned at the substantially same time with one etching process. A first panel 40a and a second panel 40b are prepared to have a first substrate and a second substrate including display devices on each first side, respectively, after completing the Display Device Forming Process (S31). In this embodiment, the first panel 40a and the second panel 40b are used for the EPD as illustrated in FIG. 3. The first and the second panels may be identical. Alternatively, the first and the second panels may have different thickness and/or a different metal alloy or metal.

The Coupling Process (S33) follows the Display Device Forming Process (S31). The first and the second panels are coupled to face first sides of the first and second substrates each other. The first sides include display devices. Referring to FIG. 7A, the first panel 40a and the second panel 40b are prepared by patterning the lower patterns 49a and 49b including the TFT array and the pixel electrode on a first substrate 31a and a second substrate 31b. Both substrates 31a and 31b have a first thickness of d1 which gives rigidity to the substrates, and include the upper arrays 43a and 43b, respectively. Alternatively, the substrates 31a and 31b may have two different thicknesses. The first panel 40a and the second panel 40b include a first area (A1) having display devices and a second area (A2) excluding the first area (A1). The second area (A2) is the edge portions of the first and second panels 40a and 40b enclosing the first area (A1). Sealant 45 is applied on the second area of at least one of the first panel 40a and the second panel 40b. The sealant 45 is not applied in the first area (A1).

After curing (or hardening) the sealant 45, the first and the second panels 40a and 40b are coupled with the first and second rigid substrates 31a and 31b facing each other. The display devices are formed on the first and the second rigid substrates 31a and 31b, as illustrated in FIG. 7B.

After the Coupling Process (S33), the second surfaces of the first substrate 31a and the second substrate 31b are removed by an etching method of the Thinning Process (S35). The lower patterns 49a and 49b and upper arrays 43a and 43b are not formed on the second surfaces of the first and the second substrates 31a and 31b in FIG. 6. After etching, the two substrates have a second thickness (d2). The second thickness (d2) gives the flexibility to the first substrate 31a and the second substrate 31b. For example, the second thickness (d2) is 35% or less of the first thickness (d1). If the substrate is an SUS substrate, the second thickness (d2) may be, for example, about 0.2 mm or less. Alternatively, the two substrates may have a different thicknesses such as a third thickness (d3) and a fourth thickness (d4).

Figure 8:
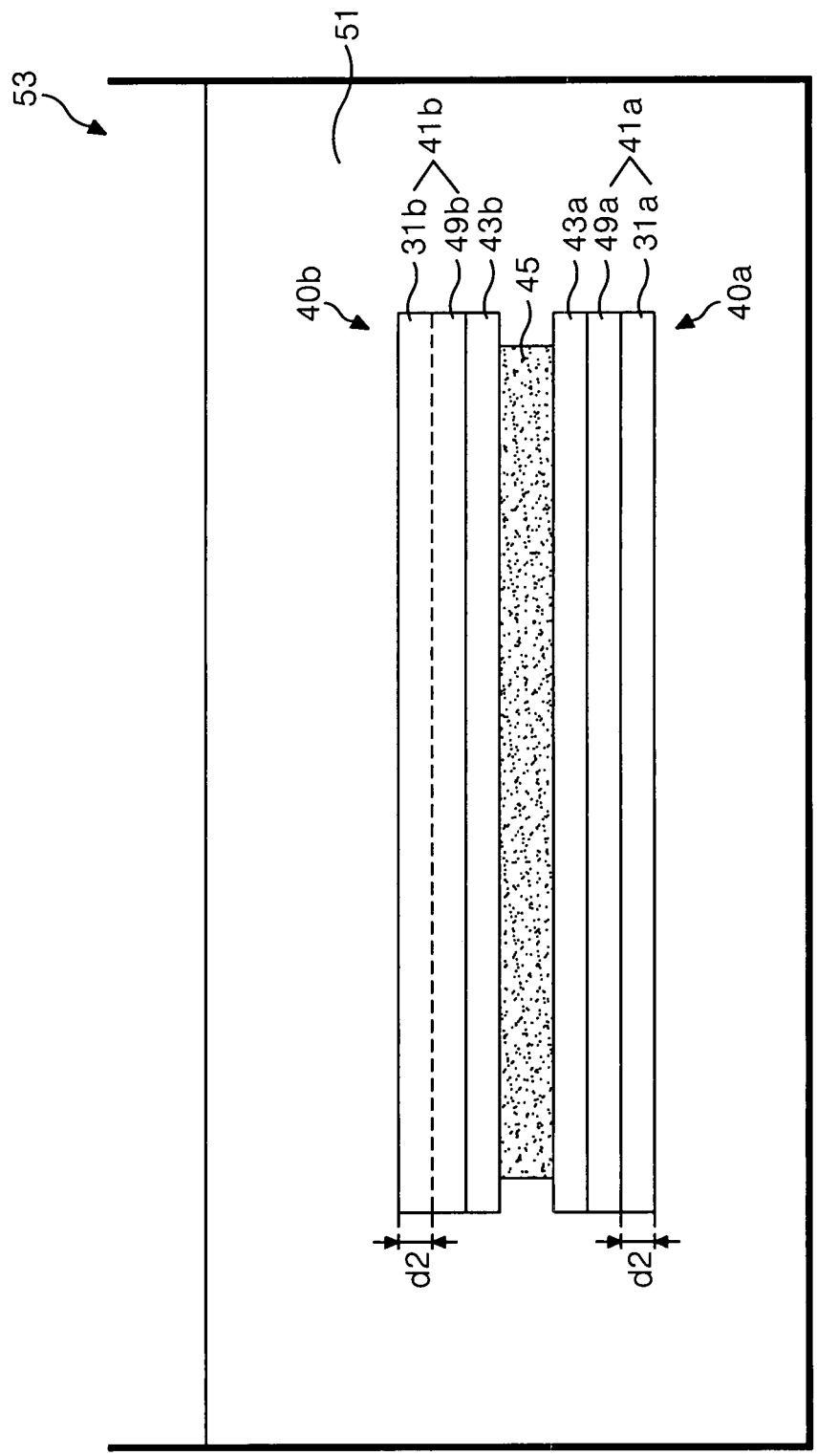
FIG. 8 illustrates one example of a thinning process according to the second embodiment.

The Thinning Process (S35) is performed by dipping the coupled first and second panels 40a and 40b into a bath 53 filled with an etchant 51 to etch out the second sides of the first and second substrate 31a and 31b as shown in FIG. 8. The etchant 51 includes a halogen element such as chloride (Cl), Bromine (Br) and Iodine (I). For the case of SUS substrate, the etchant 51 is preferably including the iron chloride ($FeCl_2$). If the first and the second panels 40a and 40b may have the different thickness, they have the third thickness (d3) and the fourth thickness (d4) after the Thinning Process (S35).

As the second sides of the first and second substrate 31a and 31b are etched, their thickness is reduced to the second thickness (d2), or alternatively, the third (d3) and/or the fourth thickness (d4). The first panel 40a and the second panel 40b may have the flexibility. The sealant 45 prevents the etchant 51 from intruding into the first area of the first panel 40a and the second panel 40b. Therefore, the display devices formed in the first area of first and second panels 40a and 40b can be protected from possible damage by the etchant 51.

Figure 9:
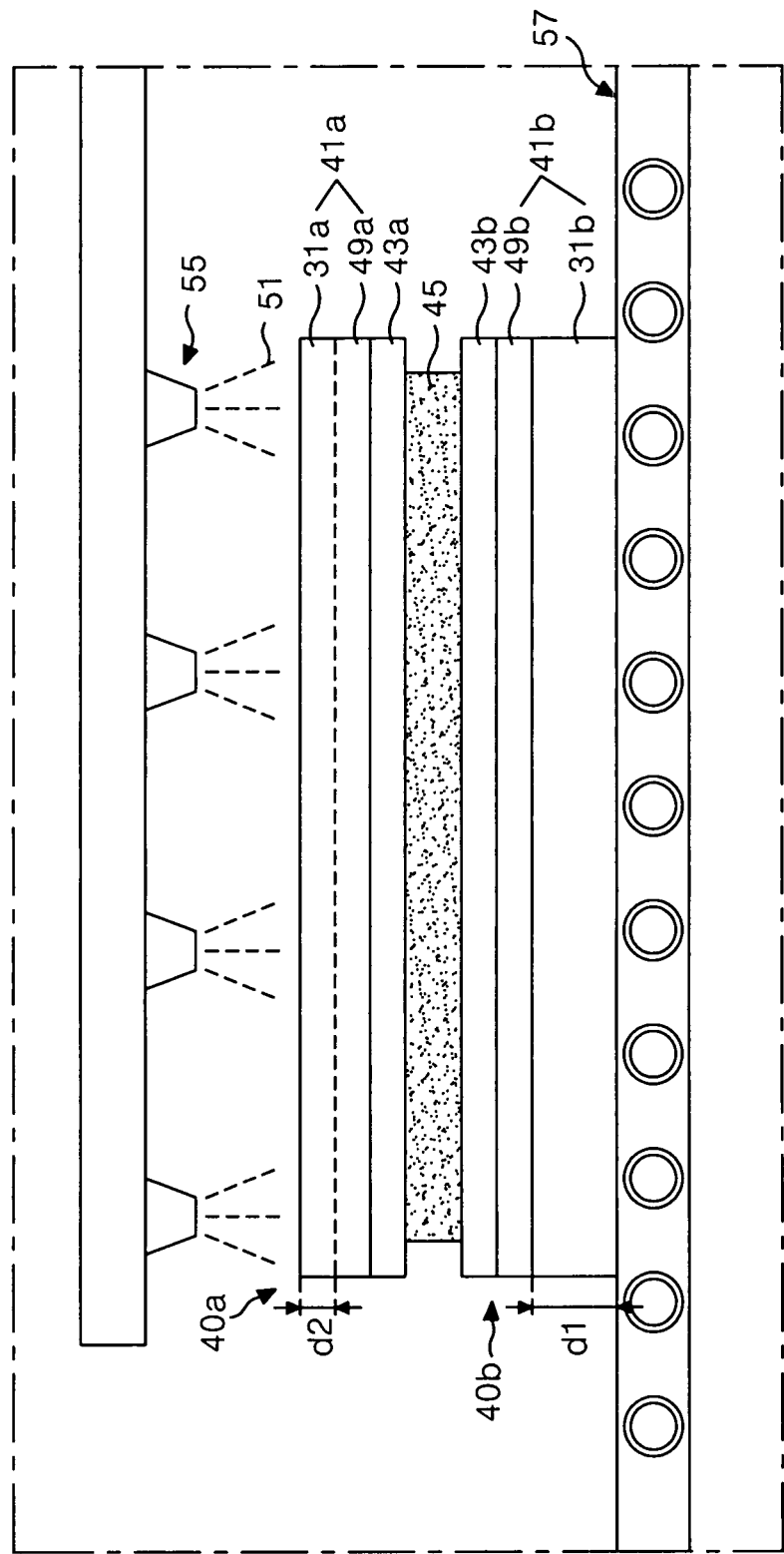
FIG. 9 illustrates another example of a thinning process according to the second embodiment.

In another example for performing the Thinning Process (S35), the second sides of the first substrate 31a and the second substrate 31b are etched by the etchant 51 sprayed from the nozzle 55. Referring to FIG. 9, the coupled first and second panels 40a and 40b are mounted on a conveyor belt 57. One of the second side of the first and second substrate 31a and 31b is exposed to the etchant 51 sprayed from the nozzle 55. The second side of the first substrate 31a is exposed to the etchant and is etched to the second thickness (d2). Subsequently, the coupled panels are turned over to expose and etch the second side of the second substrate 31b. The second substrate 31b is also etched to the second thickness (d2). As a result, the first panel 40a and the second panel 40b have the flexibility. Alternatively, the etchant may apply to both the first and the second sides of the first and the second panels 40a and 40b. Additionally, the coupled panels 40a and 40b may stand on their side when they are placed on the conveyor belt 57, so that the first and the second sides are exposed to the etchant substantially simultaneously. By differentiating the type and/or the amount of the etchant at both sides, the first panel 40a and the second 40b may have two different thicknesses as a result of the Thinning Process. Additionally, by differentiating the thicknesses of the first and the second panels 40a and 40b, the two different thicknesses may be obtained after the Thinning Process.

As explained in connection with FIG. 8, the sealant 45 may prevent the etchant 51 from intruding into the first area of the first panel 40a and the second panel 40b. Therefore, the display devices formed in the first area of first and second panels 40a and 40b can be protected from possible damage by the etchant. The remained etchant 51 is removed by using cleaning water or other cleaning liquid.

Figure 10A:
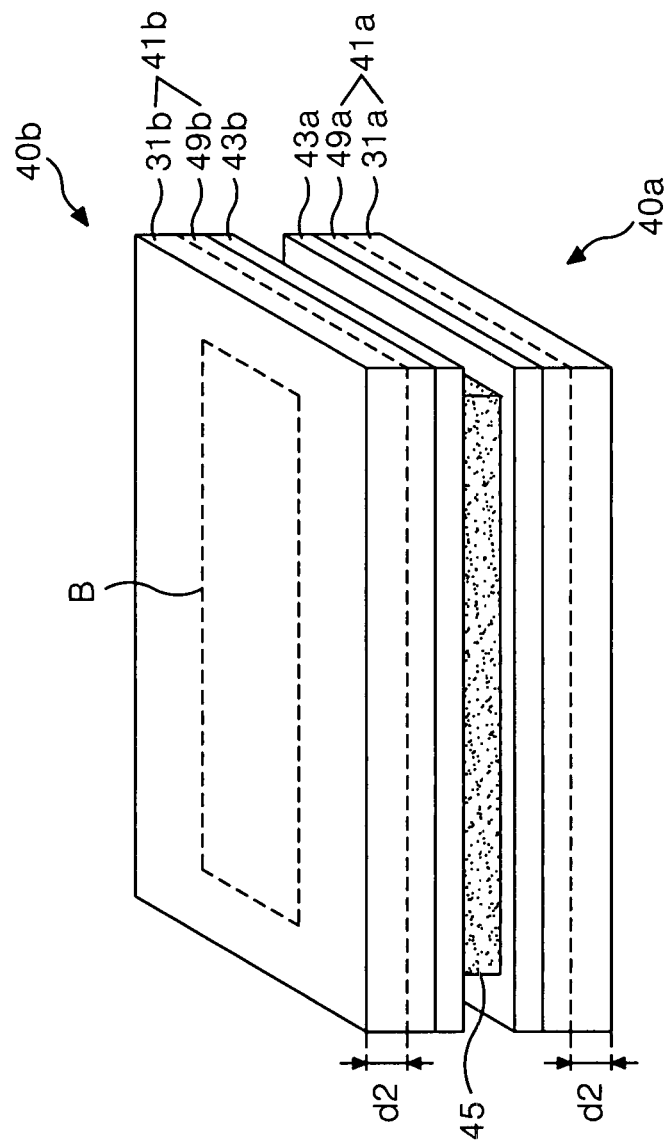

Referring back to FIG. 6, the coupled first and second panels 40a and 40b are separated into individual display panels by the Separating Process (S37). FIG. 10A illustrates that the first substrate 31a and the second substrate 31b are still coupled to each other and have the second thickness (d2) after completing the Thinning Process (S35).

Along with the cutting line (B), the sealant 45 is removed and the first panel 40a and the second panel 40b are separated from each other, as shown in FIG. 10B. The cutting line (B) is preferably disposed between the first area (A1) and sealant 45. The separated first panel 40a and the second panel 40b include the first substrate 31a and the second substrate 31b having the second thickness (d2), respectively. Therefore, two flexible display panels are obtained by using a single manufacturing process. This may improve yield and balance the speed of the manufacturing process of the flexible display panels with the rest of the manufacturing process.

FIGS. 11A and 11B illustrate various cutting methods for the Separating Process (S37). As the coupled panels have the second thickness (d2) giving the flexibility to the panel, it is easy to cut the coupled panels along the cutting line (B). For example, as shown in FIG. 11A, the coupled first and second panels 40a and 40b may be separated with a scribing wheel 81 along the cutting line (B). The scribing wheel 81 is made of material having higher strength than the first and second substrates 31a and 31b. For example, the scribing wheel 81 is made of diamond or DLC (Diamond Like Coating) material.

Another example of a cutting method is illustrated in FIG. 11B. The coupled first and second panels 40a and 40b are cut by a press cutter 83 including a cutter blade 85. The cutter blade 85 is pressed along with the cutting line (B). The rotational movement is transformed to the reciprocal movement with a crank (not shown) included in the press cutter 83. The cutter 85 can cut by pressing the panels 40a and 40b with hydraulic pressure along with the cutting line (B). Other examples of cutting methods include plasma cutting, gas cutting, laser cutting, and water pressure cutting.

In the second embodiment, the Thinning Process (S35) is performed after attaching the upper array to the lower array. Alternatively, the upper array can be attached to the lower array after completing the Separating Process (S37).

The flexible substrate is acquired by etching one side of the substrate after forming the display devices on the opposite side. Therefore, the thickness of the substrate is changed from the first thickness which gives the rigidity to the substrate to the second thickness which gives flexibility to the substrate. Further, to prevent any etching damage on the display devices, and to enhance the production yield of the thinning process, two panels having display devices on the first side are coupled to each other by means of a sealant before the etching process. After separating the two panels, two individual flexible substrates for flexible display panels may be obtained without any defects and manufacturing cost may not increase.

It should be understood that the invention is not limited to the embodiments. Various changes or modifications can be made under the condition that those changes or modifications do not depart from the spirit of the invention. Accordingly, the scope of the invention shall be determined only by the appended claims and its equivalents.

The invention claimed is:

1. A method for manufacturing a flexible display device, the method comprising:
providing a substrate having a first thickness and forming display devices on a device side of the substrate; and
dipping a side of the substrate that is opposite the device side into an etchant by an amount that is less than the first thickness such that the substrate is only partially submerged within the etchant to thereby remove surface portions from the opposite side of the substrate, such that a thickness of the substrate is changed from the first thickness, in which the substrate is substantially rigid, to a second thickness in which the substrate is substantially flexible,
wherein the device side is not dipped into the etchant when the side of the substrate that is opposite the device side is dipped into the etchant.

2. The method of claim 1, wherein providing a substrate comprises providing a metal alloy substrate, and wherein removing surface portions comprises etching with a halogen.

3. The method of claim 1, wherein providing a substrate comprises providing a metal substrate, and wherein removing surface portions comprises etching with an selected etchant suitable for the metal substrate.

4. The method of claim 1, wherein providing a substrate comprises providing a stainless steel substrate, and wherein removing surface portions comprises etching with iron chloride.

5. The method of claim 1, wherein removing surface portions comprises etching the substrate to a second thickness of about 0.2 mm or less.

6. The method of claim 1 forming display devices comprises forming a TFT array on the substrate, a passivation layer overlying the TFT array, and an adhesive layer overlying the passivation layer.

7. The method of claim 6, further comprising:
providing a base film and forming electrophoresis display components on the base film; and
coupling the electrophoresis display components to the substrate, such that electrophoresis display components are bonded to the substrate by the adhesive layer.

* * * * *